(12) United States Patent
Standing

(10) Patent No.: US 10,361,178 B2
(45) Date of Patent: Jul. 23, 2019

(54) INTERCONNECTION STRUCTURE, LED MODULE AND METHOD

(71) Applicant: Infineon Technologies Austria AG, Villach (AT)

(72) Inventor: Martin Standing, Velden (AT)

(73) Assignee: Infineon Technologies Austria AG, Villach (AT)

( * ) Notice: Subject to any disclaimer, the term of this patent is extended or adjusted under 35 U.S.C. 154(b) by 321 days.

(21) Appl. No.: 14/868,488

(22) Filed: Sep. 29, 2015

(65) Prior Publication Data

US 2017/0092631 A1 Mar. 30, 2017

(51) Int. Cl.
*H01L 25/16* (2006.01)
*H01L 21/027* (2006.01)
(Continued)

(52) U.S. Cl.
CPC ........ *H01L 25/167* (2013.01); *H01L 21/0273* (2013.01); *H01L 24/13* (2013.01); *H01L 24/16* (2013.01); *H01L 24/17* (2013.01); *H01L 24/81* (2013.01); *H01L 25/0753* (2013.01); *H01L 33/62* (2013.01); *H01L 24/11* (2013.01); *H01L 24/94* (2013.01); *H01L 24/97* (2013.01); *H01L 2224/1147* (2013.01);
(Continued)

(58) Field of Classification Search
CPC ....... H01L 21/0273; H01L 2224/11462; H01L 2224/11464; H01L 2224/1147; H01L 2224/13082; H01L 2224/13147; H01L 2224/1319; H01L 2224/1601; H01L 2224/16057; H01L 2224/16058; H01L 2224/16145; H01L 2224/16227; H01L 2224/8102; H01L 2224/811; H01L 2224/81191; H01L 2224/81192; H01L 2224/81447; H01L 2224/8185; H01L 2224/81862; H01L 2224/8192; H01L 2224/94; H01L 2224/97; H01L 24/11; H01L 24/13; H01L 24/16; H01L 24/17; H01L 24/81; H01L 24/94; H01L 24/97; H01L 25/0753; H01L 25/167; H01L 2924/06; H01L 2924/0635; H01L 2924/0665; H01L 2924/0675; H01L 2924/07802; H01L 2924/0781; H01L 2924/12041; H01L 2924/1426; H01L 2933/0066; H01L 33/62
See application file for complete search history.

(56) References Cited

U.S. PATENT DOCUMENTS 4,675,243 A * 6/1987 Obinata ............ H01L 23/49866
257/E23.072
6,252,779 B1 * 6/2001 Pierson .................. H05K 1/113
29/840
(Continued)

*Primary Examiner* — Cuong Q Nguyen
(74) *Attorney, Agent, or Firm* — Murphy, Bilak & Homiller, PLLC

(57) ABSTRACT

In an embodiment, an interconnection structure includes a first semiconductor device including a conductive stud, a second device including a contact pad, an adhesive layer including an organic component arranged between a distal end of the conductive stud and the contact pad, the adhesive layer coupling the conductive stud to the contact pad, and a conductive layer extending from the conductive stud to the contact pad. The conductive layer has a melting point of at least 600° C.

19 Claims, 4 Drawing Sheets

(51) Int. Cl.
*H01L 23/00* (2006.01)
*H01L 25/075* (2006.01)
*H01L 33/62* (2010.01)

(52) U.S. Cl.
CPC ........... *H01L 2224/11462* (2013.01); *H01L 2224/11464* (2013.01); *H01L 2224/1319* (2013.01); *H01L 2224/13082* (2013.01); *H01L 2224/13147* (2013.01); *H01L 2224/1601* (2013.01); *H01L 2224/16057* (2013.01); *H01L 2224/16058* (2013.01); *H01L 2224/16145* (2013.01); *H01L 2224/16227* (2013.01); *H01L 2224/811* (2013.01); *H01L 2224/8102* (2013.01); *H01L 2224/8185* (2013.01); *H01L 2224/8192* (2013.01); *H01L 2224/81191* (2013.01); *H01L 2224/81192* (2013.01); *H01L 2224/81447* (2013.01); *H01L 2224/81862* (2013.01); *H01L 2224/94* (2013.01); *H01L 2224/97* (2013.01); *H01L 2924/06* (2013.01); *H01L 2924/0635* (2013.01); *H01L 2924/0665* (2013.01); *H01L 2924/0675* (2013.01); *H01L 2924/0781* (2013.01); *H01L 2924/07802* (2013.01); *H01L 2924/12041* (2013.01); *H01L 2924/1426* (2013.01); *H01L 2933/0066* (2013.01)

(56) References Cited

U.S. PATENT DOCUMENTS

| | | |
|---|---|---|
| 6,448,108 B1 | 9/2002 | Lin |
| 2010/0109159 A1 | 5/2010 | Ho et al. |
| 2010/0148374 A1* | 6/2010 | Castro .................. H01L 24/11 257/778 |
| 2013/0241071 A1* | 9/2013 | Hsieh .................... H01L 24/11 257/773 |
| 2014/0138543 A1* | 5/2014 | LaVeigne ................ G01J 5/20 250/338.1 |
| 2015/0187740 A1 | 7/2015 | McGroddy et al. |

* cited by examiner

A)

B)

C)

D)

US 10,361,178 B2

INTERCONNECTION STRUCTURE, LED MODULE AND METHOD

BACKGROUND

An electronic component may include one or more semiconductor devices in a package. The package includes internal electrical connections from the semiconductor device to a substrate or a leadframe which includes outer contacts. The internal electrical connections may be provided by solder balls or bond wires, for example. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

SUMMARY

In an embodiment, an interconnection structure includes a first semiconductor device including a conductive stud, a second device including a contact pad, an adhesive layer including an organic component arranged between a distal end of the conductive stud and the contact pad, the adhesive layer coupling the conductive stud to the contact pad, and a conductive layer extending from the conductive stud to the contact pad. The conductive layer has a melting point of at least 600° C.

In an embodiment, a module for a lighting system includes a LED array device arranged on a LED driver device. The LED array device includes a plurality of conductive studs electrically coupled to a plurality of conductive contact pads on the LED driver device by a plurality of connection structures. Each connection structure includes an adhesive including an organic component arranged between a distal end of one of the conductive studs and one of the contact pads and a conductive layer. The conductive layer extends on side faces of the conductive stud, side faces of the adhesive and on the contact pad. The conductive layer has a melting point of at least 600° C.

In an embodiment, a method includes applying an adhesive including an organic component to a distal end of a conductive stud arranged on a first semiconductor device, attaching the conductive stud to a contact pad arranged on a second device by way of the adhesive, and applying a conductive layer having a melting point of at least 600° C. such that the conductive layer extends between the conductive stud and the contact pad.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
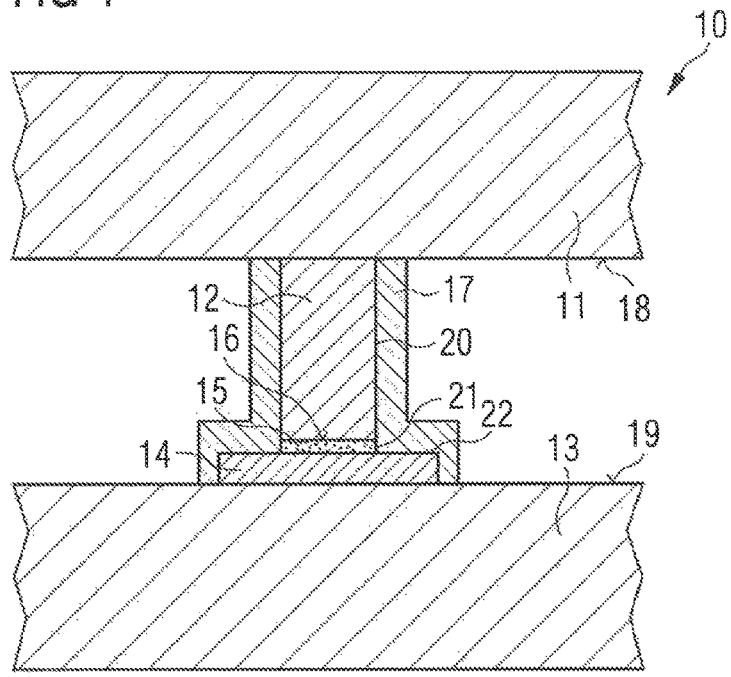
FIG. 1 illustrates an interconnection structure.

FIG. 1 illustrates an interconnection structure 10 including a first semiconductor device 11 including at least one conductive stud 12 and a second device 13 including at least one contact pad 14. The interconnection structure 10 further includes an adhesive layer 15 which includes at least one organic component. The adhesive layer 15 is arranged between a distal end 16 of the conductive stud 12 and the contact pad 14. The interconnection structure 10 further includes a conductive layer 17 which extends from the conductive stud 12 to the contact pad 14. The conductive layer 17 includes a melting point of at least 600° C. or in some embodiments at least 900° C. The second device 13 may be a semiconductor device or a substrate, such as a redistribution board.

In some embodiments, the arrangement of the conductive stud and contact pad is reversed so that the conductive stud is first arranged on the second device, such as the second semiconductor device or substrate, and the contact pad is first arranged on the first semiconductor device.

The conductive stud 12 protrudes substantially perpendicularly from a first major surface 18 of the first semiconductor device 11 and may have a substantially cylindrical form. The conductive stud 12 may alternatively be described as a pillar, stud bump or pin. The conductive stud 12 may have an aspect ratio such that its diameter to height ratio lies within the range of 1:1 to 2:1. The contact pad 14 is arranged on the first major surface 19 of the second device 13 and faces towards the distal end 16 of the conductive stud 12. The conductive stud and the contact pad may include a metal, such as copper, or an alloy.

The adhesive layer 15 includes at least one component which is organic. The adhesive layer may be electrically insulative. The organic component of the adhesive layer 15 may include an epoxy, a cyanate ester or a cyanoacrylate, for example. The adhesive layer may include further components in addition to the organic component or a single organic component.

The adhesive layer 15 may be used to mechanically couple the conductive stud 12 to the contact pad 14 and, therefore, the first semiconductor device 11 to the second device 13. In embodiments in which the adhesive layer 15 is electrically insulative, the adhesive layer 15 may mechanically couple the first semiconductor device 11 to the second device 13 without electrically coupling the first semiconductor device 11 to the second device 13. In these embodiments, the electrical connection between the conductive stud 12 and the contact pad 14 is provided solely by the conductive layer 17. The conductive layer 17 may also provide mechanical coupling between the conductive stud 12 and the contact pad 14.

In some embodiments, the adhesive may include a conductive component in addition to the at least one organic component such that the adhesive layer 15 is electrically conductive. In these embodiments, the adhesive layer 15 also contributes to the electrical connection between the first semiconductor device 11 and the second device 13

The interconnection structure 10 includes the conductive layer 17 which is arranged on side faces 20 of the conductive stud 12, side faces 21 of the adhesive layer 15 and on portions 22 of the contact pad 15 which remain uncovered by the adhesive layer 15 and the conductive stud 12. The conductive layer 17 may have a substantially tubular shape and may completely surround the conductive stud 12. The conductive layer 17 is electrically conductive and includes a material having a melting point of at least 600° C., or in some embodiments at least 900° C. The conductive layer 17 may include a metal such as aluminium which has a melting point of around 660° C., copper which has a melting point of around 1084° C. or silver which has a melting point of around 961° C. The conductive layer 17 may include an alloy which may include one or more of these metals.

The conductive layer 17 in combination with the conductive stud 12 and the conductive contact pad 14 provides a single electrically conductive interconnection structure 10 which may be used to couple the first semiconductor device 11 to the second device 13. The metal or alloy providing the conductive layer 17 may be applied directly to the side faces of the conductive stud 12 and the contact pad 14, for example, by electroless plating. The conductive layer 17 provides the electrical connection between the conductive stud 12 of the first semiconductor device 11 and the contact pad 14 of the second device without being melted at any subsequent processing stage.

The interconnection structure 10 is soft solder-free and diffusion solder-free. Soft solder is defined herein as a fusible alloy having a melting point or range of less than 450° C. The conductive layer has a higher melting point of at least 600° C. or at least 900° C. A joint produced by a diffusion solder includes at least one intermetallic compound including at least one element from each of the joined components.

Electroless plating is also known as chemical or autocatalytic plating and describes a non-galvanic plating method that includes simultaneous reactions in an aqueous solution which occur without the use of external electrical power so that a layer is deposited on a substrate which is in contact with the solution. Electroplating differs from electroless plating in that an external electrical power source is used.

The adhesive layer 15 has a thickness which is sufficiently small that the build-up of conductive material on the side faces 20 of the conductive stud 12 and on the contact pad 14 bridges the region occupied by the side faces 21 of the adhesive layer 15 to provide a continuous, low resistance conductive path between the first semiconductor device 11 and the semiconductor device 13.

The conductive stud 12 may include a metal or an alloy and may have melting point of at least 600° C. or at least 900° C. For example, the conductive stud 12 may include copper and may be fabricated by electroplating or electroless plating. The contact pad 14 may also include copper. The conductive stud 12 and the contact pad 14 may include a metal or alloy having a higher melting point that the melting point of the conductive layer 17. The conductive stud 12, contact pad 14 and conductive layer 17 may each include copper.

Whilst the conductive layer 17 may be applied directly to the side faces 20 of the conductive stud 12 and portions 22 of the contact pad 14, a multilayer structure may be deposited. For example, a further layer may be applied to the conductive stud 12 and contact pad 14 before deposition of the conductive layer 17. This further layer may serve as an adhesion promoter and/or a diffusion barrier, for example. A further layer may be deposited on the conductive layer 17 which acts as a corrosion resistance layer.

The interconnection structure 10 may be used to couple high density IC devices, such as processors and other logic devices, one to another to create a stacked arrangement of two or more semiconductor devices or to a couple a semiconductor device to a substrate. In high density IO devices, the electrical interconnections may be arranged in a matrix or array having a pitch.

In some embodiments, the second device is a semiconductor device and one of the first semiconductor device and the second conductive device includes driver circuitry and the other one of the first semiconductor device and the second semiconductor device includes circuitry switchable by the driver circuitry.

One example of an application in which the interconnection structure may be used is a dynamic LED (Light Emitting Diode) lighting application, in which an LED array device is mounted onto the surface of a device for driving the LED array device. In a module for such a lighting system, the LED array device may include a plurality of conductive studs. Each conductive stud may be electrically coupled to one of a plurality of conductive contact pads arranged on the LED driver device by a connection structure. The connection structure includes an adhesive including at least one organic component arranged between a distal end of the conductive stud and the contact pad and a conductive tube extending on side faces of the conductive stud, side faces of the adhesive and on the contact pad. The conductive tube has a melting point of at least 600° C.

The driver circuitry of the LED driver device may include a plurality of current sources and the LED array device may include a plurality of LED pixels. Each current source drives a LED pixel so that each LED pixel may be driven or switched individually, independently of the other LED pixels. Each current source of the LED driver device may be coupled to a contact pad and each pixel of the LED may be coupled to a conductive stud.

Figure 2:
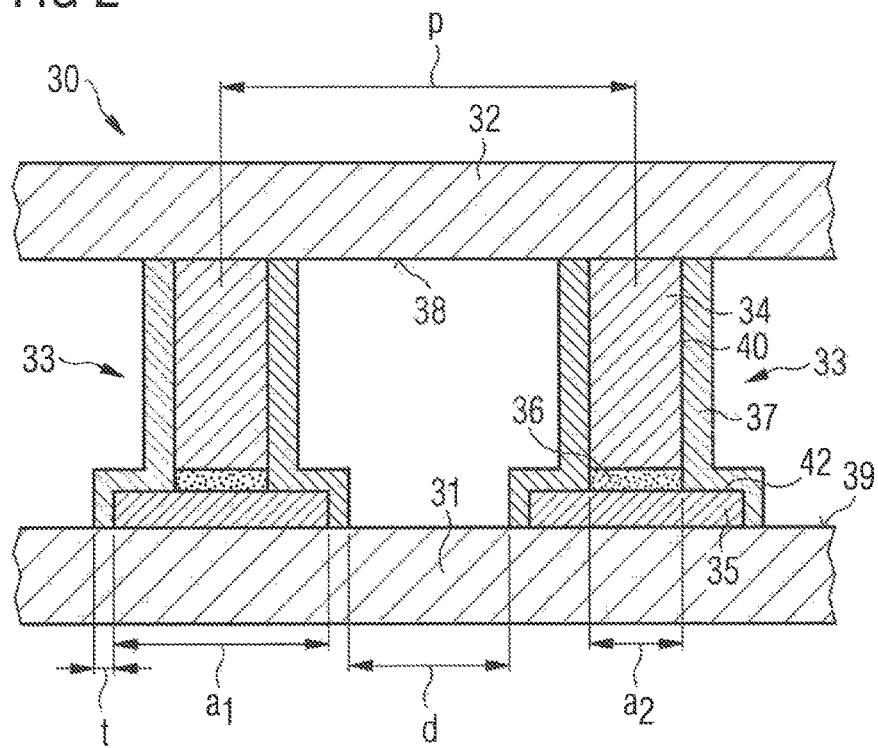
FIG. 2 illustrates two interconnection structures arranged between two semiconductor devices.

FIG. 2 illustrates a stack 30 of semiconductor devices 31, 32 which are electrically coupled by a plurality of conductive connection structures 33 arranged in a matrix or array. The conductive connection structures 33 may be arranged in a square grid array, a rectangular grid array or a hexagonal array, for example.

Each of the conductive connection structures 33 includes a conductive stud 34, a contact pad 35, an adhesive layer 36 and a conductive layer 37. The conductive stud 34 is arranged on a first major surface 38 of the second semiconductor device 32 and the contact pad 35 is arranged on a first major surface 39 of the first semiconductor device 31. The conductive stud 34 is coupled to the contact pad 35 by the adhesive layer 36 which may be electrically insulating. The conductive layer 37 covers side faces 40 of the conductive stud 34, side faces 41 of the adhesive layer 36 and outer surfaces 42 of the contact pad 35.

The conductive layer 37 may be applied after the semiconductor devices 31, 32 have been mechanically joined to one another by means of the adhesive layer 36 arranged between the conductive stud 34 and the contact pad 35. The conductive layer 37 may be applied on each of the connection structures provided by the conductive stud 34, adhesive layer 36 and contact pad 35 substantially simultaneously by methods such as electroless plating.

The major surfaces 38, 39 of the two semiconductor devices 31, 32 are spaced apart by the conductive connection structures 33 and by a distance corresponding to the height of the conductive stud 34, thickness of the adhesive layer 36 and thickness of the contact pad 35. This gap enables an electroplating solution to cover the side faces 40 of the conductive stud 34 and outer surfaces 42 of the contact pad 35 such that material can be deposited from the electroplating solution onto the side faces 40 of the conductive stud 40 and outer surfaces 42 of the contact pad 35 to form the conductive layer 37. By building up the thickness of the conductive layer 37, the gap occupied by the side faces 41 of the adhesive layer 36 is bridged by the conductive layer 37 such that the conductive stud 34 is electrically coupled to the contact pad 35. An electroless plating method may be used so that material is deposited from the electroplating solution without the use of an external power supply.

The cross-sectional area of the conductive connection structure 33 includes the cross-sectional area of the conductive stud 34 and the additional thickness of the conductive layer 37 so that the contact resistance and current carrying capability of the interconnection structure 33 is increased in comparison to an arrangement using the conductive pad 34 with the conductive layer 37 omitted.

The conductive connection structures 33 are arranged in an array having a pitch p and may be required to be capable of carrying a predetermined current I which may be dependent on the application. For example, the pitch p may be 75 µm to 125 µm and the current I may be 2 mA to 8 mA.

The size of the contact area on one or both of the semiconductor devices 31, 32 may also have a predefined maximum area. For example, the contact area $a_1$ available for each electrical connection on the first semiconductor chip 31 may lie in the range of 20 µm to 50 µm and the contact area $a_2$ available for each electrical connection on the second semiconductor chip 32 may lie in the range of 10 µm to 40 µm. The minimum distance d between neighbouring conductive connection structures 33 may also be predetermined in order to provide sufficient electrical insulation. For example, the distance d may lie in the range of 20 µm to 50 µm.

The minimum size of the contact pad $a_{1min}$ may be determined by the diameter of the conductive stud $a_2$, the thickness t of the conductive layer and the die positioning accuracy δ. For example $a_{1min} = a_2 + 2t + 2δ$.

Figure 3:
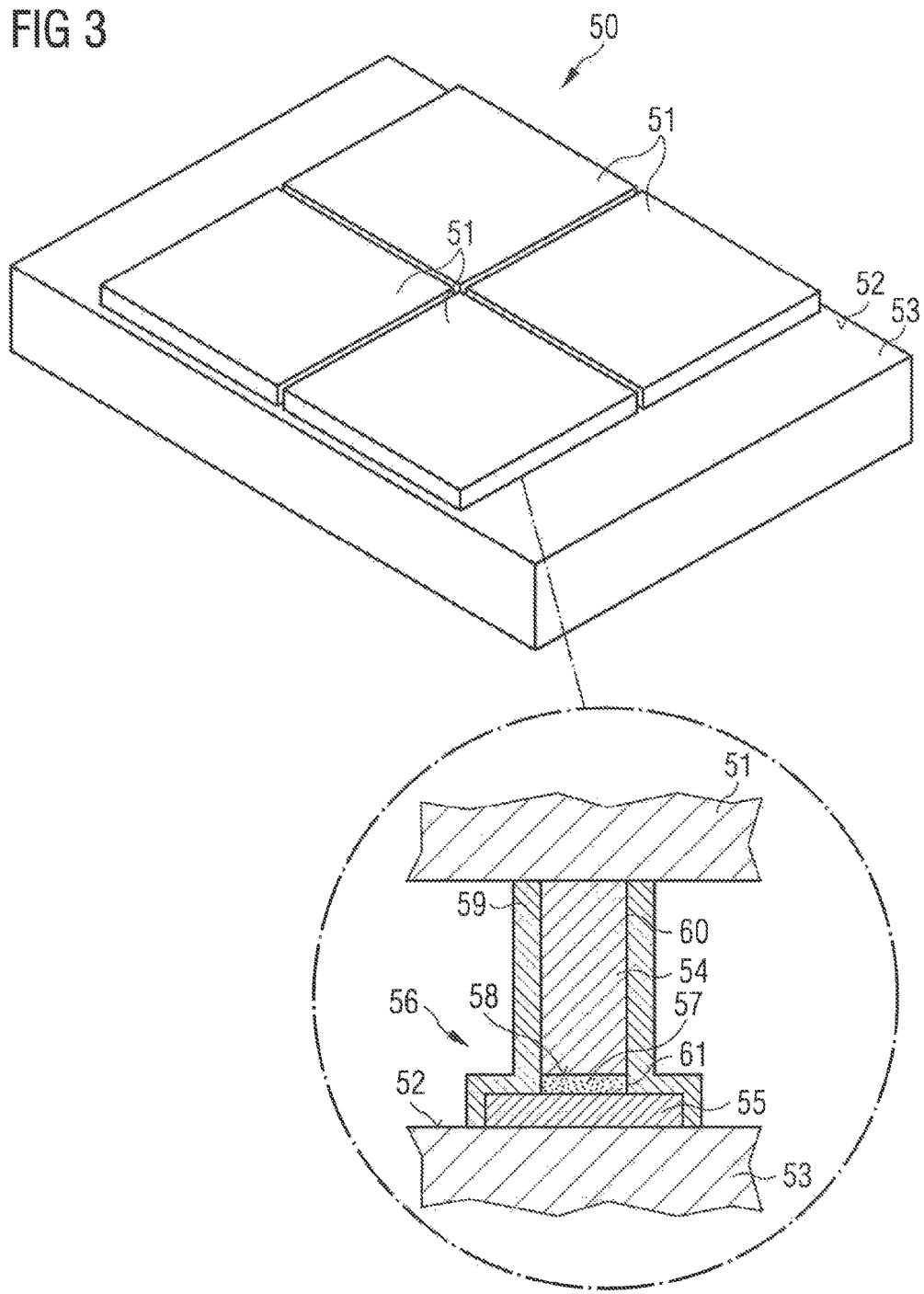
FIG. 3 illustrates a first semiconductor device mounted on a second semiconductor device by a plurality of interconnection structures.
Figure 4:
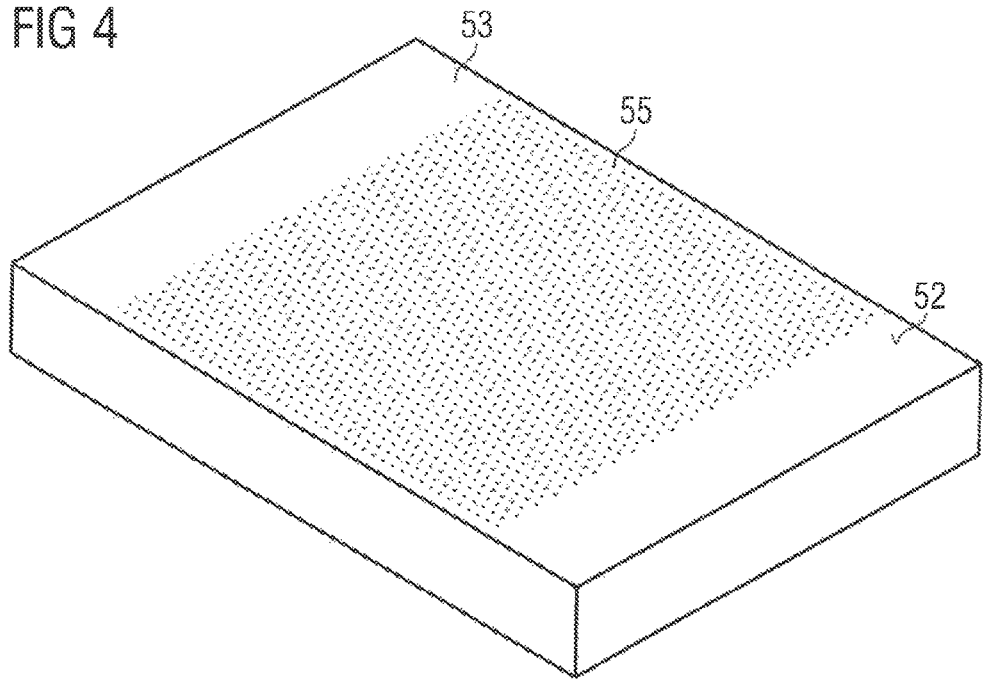
FIG. 4 illustrates a semiconductor device including contact pads arranged in an array.
Figure 5:
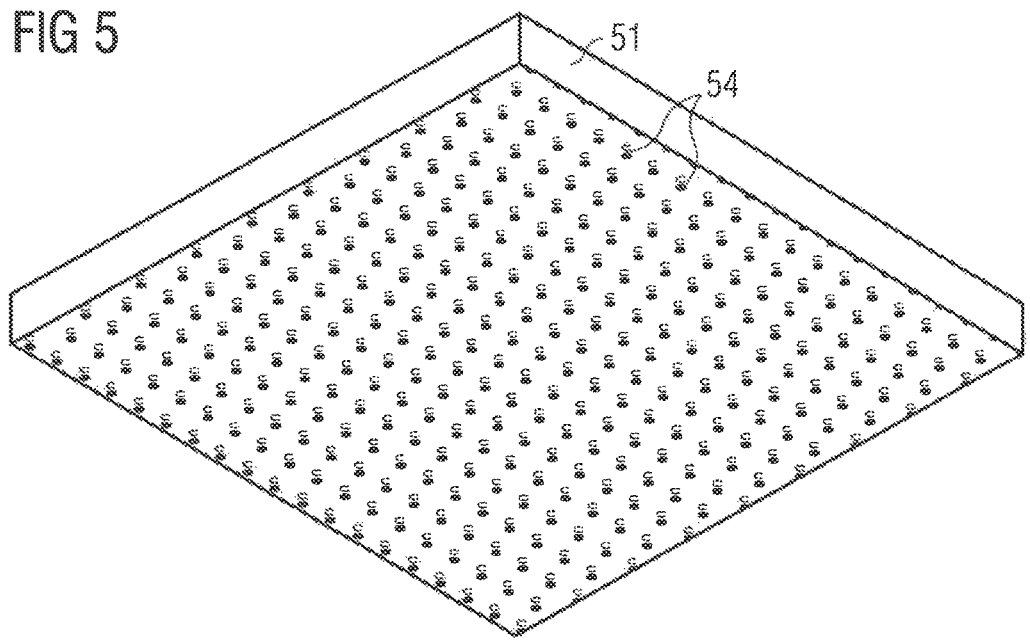
FIG. 5 illustrates a semiconductor device including conductive studs arranged in an array.

FIGS. 3 to 5 illustrate an LED module 50 including one or more LED array devices 51 mounted on a major surface 52 of a device 53 for driving the LED array device 51.

FIG. 4 illustrates a perspective view of the LED driver device 53 and, in particular, contact pads 55 arranged on the major surface 52 in an array pattern complementary to a pattern of conductive studs 54 on the LED array device 51. FIG. 5 illustrates a perspective view of the LED array device 51 and conductive studs 54 arranged in an array.

Each conductive stud 54 may be electrically coupled to one of a plurality of conductive contact pads 55 arranged on the LED driver device 53 by a connection structure 56. The connection structure 56 includes an adhesive 57 including at least one organic component arranged between a distal end 58 of the conductive stud 54 and the contact pad 55 and a conductive layer 59 extending on side faces 60 of the conductive stud 54, side faces 61 of the adhesive 57 and on the contact pad 55. The conductive layer 59 includes a metal or an alloy having a melting point of at least 600° C.

In this particular embodiment, the LED driver device 53 includes an array or matrix of 32×32 current sources, each coupled directly to a LED pixel on an LED array device 51 to allow each LED pixel to be individually switched. By allowing each pixel to be switched individually, a dynamically shapeable lighting system may be provided, for example, for a car headlamp application. In this particular embodiment, 1024 contacts are disposed on a 125 µm pitch and each has a current carrying rating of 5 mA per connection. The LED array device 51 has a connection point for each pixel of 15 µm diameter with 20 µm of isolation around the contact area. In this particular application, the conductive studs include copper and have a height of 15 µm.

It is desirable that the connections between the conductive studs 54 and contact pads 55 provided by the adhesive 57 and conductive layer 59 are reliable and have a suitable thermal conductivity, dissipation and thermally induced fatigue resistance.

The conductive layer 59 may be deposited onto the conductive surfaces of the side faces 60 of the conductive stud 54 and on the outer conductive surface of the contact pad 55 by electroless plating with the side faces 61 of the electrically insulating adhesive 57 being covered due to the buildup of the thickness of the conductive layer on the neighbouring conductive surfaces. The conductive layer 59 need not nucleate on the side faces 61 of the adhesive 57.

In order to assist the electroless plating process to strike to the conductive surfaces, the electroless plating solution may be adjusted or tuned to selectively plate to the metallic surfaces only. The gap between the two devices may be increased to assist in the insertion and movement of the solution. If the adhesive layer is only 2-3 μm thick and 5 μm of copper are plated on two fronts simultaneously, i.e. onto the contact pad and the conductive stud, the adhesive will be bridged.

Using a high build, electroless plating process, a copper layer having a thickness of 5 μm may be deposited in under 1 hour. The distance between the two die surfaces or the substrate and the die may be in the range of 10 s of microns. In order to assist deposition, fluid exchange may be assisted using techniques such as forming pressurized streams, forming air bubbles, megasonic agitation and ultrasonic agitation.

The contact pads 55 of the LED driver device 53 may have a larger diameter than the diameter of the contact studs 54 of the LED array device 51. The diameter of the contact pads 55 may be at least the diameter of the conductive stud 54+the die bond tolerance+the thickness of the conductive layer deposited by electroless plating. For example if the diameter of the conductive stud is 15 μm, the die-bonding accuracy is +/−5 μm and the conductive layer thickness is 5 μm, then the pad diameter is at least 35 μm.

The contact pad 55 and conductive stud 54 formation may be exchanged. For example, the conductive studs 54 may be formed on the LED driver device 53 and the contact pads 55 on the LED array device 51.

Figure 6:
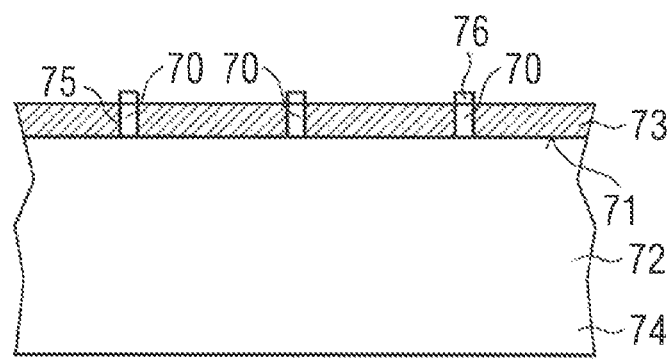
FIG. 6 illustrates a semiconductor device including conductive studs and an adhesive layer.

FIG. 6 illustrates the fabrication of conductive studs 70 on a major surface 71 of a semiconductor device 72. The conductive studs 70 can be produced by applying plating resist 73 to the surface of a semiconductor wafer 74 where plating and the deposition of the conductive studs 70 is not required to produce a plurality of openings 75 in which the conductive studs 70 are deposited. A conductive layer, for example copper, is deposited into the openings 75. The conductive layer may be deposited until the openings 75 are filled such that the conductive studs 70 are substantially coplanar with an outer surface of the photoresist layer or protrude above the photoresist layer. After deposition, the photoresist may be removed to leave the conductive studs 70 protruding from the surface 71. The conductive layer may be deposited by electroplating or electroless plating.

The height and shape of the stud 70 may be controlled using this method. For example, when if the thickness of the plating resist 73 matches the target height for the conductive studs 70, the plating process may be adjusted to alter the shape of the top of the stud 70 to create the most suitable shape for the subsequent processes. For example, the top or distal end of the stud 70 may be enlarged to form a mushroom-type or rivet-head shape. This form may be achieved if the deposition process is continued for a time period after the stud 70 has reached a height which corresponding to the depth of the opening 75. If an electroplating process is used, the plating conditions such as the amperage may be adjusted to form a particular shape of the top of the stud 70. The adhesive 76 for the connection structure may be applied to the conductive studs 70 before the removal of the plating resist 73.

Figure 7:
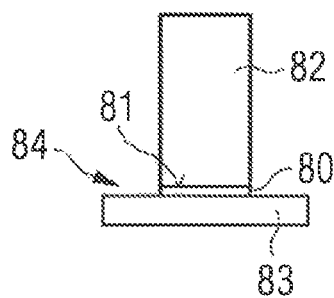
FIG. 7 illustrates adhesive connections between a conductive stud and contact pad.
Figure 7:
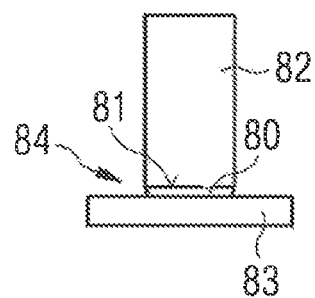
Figure 7:
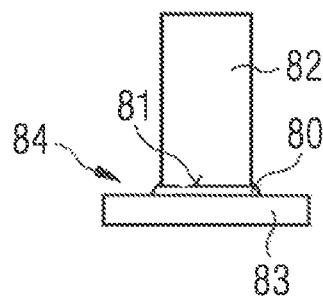
Figure 7:
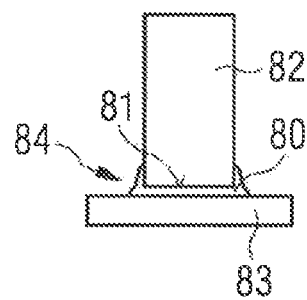

FIG. 7 illustrates the application of an adhesive 80 between the distal ends 81 of conductive studs 82 and a corresponding contact pad 83.

FIG. 7 illustrates different possible shapes of the adhesive layer 80. In these examples, the joint 84 provided by example A provides the shortest path between the conductive stud 82 and contact pad 83 as the lateral extent of the adhesive layer 80 is substantially the same as the cross-sectional area of the conductive stud 82. Arrangements in which the lateral extent of the adhesive layer 80 is less than the cross-sectional are of the conductive stud 82 such that there is a small amount of undercut, as illustrated in example B and or the lateral extent of the adhesive layer 80 is greater than the cross-sectional are of the conductive stud 82 such that there is some excess material, as illustrated in example C, may be used. However, in example D the larger amount of excess adhesive material around the conductive stud and contact pad may affect the electrical and the thermal connection paths and the adhesion of the deposited conductive layer to the adhesive.

A very low viscosity adhesive medium and a separate catalyzer or activator may be used. For example, a bondline of less than 5 μm, perhaps 2 μm to 3 μm may be used when using a non-conductive adhesive. The adhesive may be based on one of several systems, such as epoxy, cyanate ester, or cyanoacrylate for example. In some embodiments, the adhesive is applied such that it only reacts directly in the presence of a catalyst or activator. Part A of the adhesive system can be applied across portions or the entire surface of the first structure to be adhered, for example the wafer including the driver devices. Part B of the adhesive system, the catalyst or activator, can be applied to localized area(s) of the second surface, for example the ends of the conductive studs.

The curing process is dependent on the adhesive system. For example, for cyanate ester systems curing and bonding may be achieved in seconds. For epoxy systems, an oven cure for up to one hour may be used. Once cured, any excess adhesive may be removed by washing in a solvent.

A low temperature process with curing carried out at temperatures of less than 150° C. may simplify processing. For example, in the case of the use of a two part adhesive system, the removal of the uncured part A of the adhesive may be simpler. Whilst the adhesive may be structurally stable and may be used to provide mechanical strength to the interconnection, the conductive layer may also provide some or the majority of the mechanical strength of the joint between the two devices.

After the adhesive layer 80 is cured, a conductive layer is applied to the conductive stud 82 and contact pad 83 by electroless plating. The thickness of the deposited layer builds up on the conductive surfaces and bridges the gap between the conductive surfaces of the conductive stud 82 and contact pad 83 which is occupied by the adhesive layer 80. The conductive layer provides the electrical connection between the conductive stud 82 and contact pad 83 in the as-deposited state so that, in contrast to a solder joint, no further melting of the conductive layer is performed, also during post-deposition processing, in order to electrically couple the conductive stud 82 and the contact pad 83.

For the purposes of illustration, a single semiconductor device or partial view of a single semiconductor device is described above. However, the methods or some parts of the methods described herein may be carried out at the wafer level. For example, the application of the conductive studs and contact pads may be carried out on a wafer including many devices. The attachment of the devices to one another by curing the adhesive may be carried out after the devices have been singulated from their respective wafer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An interconnected structure, comprising:
a first semiconductor device comprising a conductive stud;
a second device comprising a contact pad;
an adhesive layer comprising an organic component arranged between a distal end of the conductive stud and the contact pad, the adhesive layer coupling the conductive stud to the contact pad; and
a conductive layer extending from the conductive stud to the contact pad and extending over an edge side of the contact pad, the conductive layer having a melting point of at least 600° C.

2. The interconnected structure of claim 1, wherein the adhesive layer is electrically conductive.

3. The interconnected structure of claim 1, wherein the adhesive layer is electrically insulative.

4. The interconnected structure of claim 1, wherein the adhesive layer is selected from the group consisting of an epoxy, a cyanate ester and a cyanoacrylate.

5. The interconnected structure of claim 1, wherein the conductive layer comprises a conductive tube.

6. The interconnected structure of claim 1, wherein the second device is a redistribution board.

7. The interconnected structure of claim 1, wherein the second device is a semiconductor device.

8. The interconnected structure of claim 1, wherein one of the first semiconductor device and the second device comprises driver circuitry and the other one of the first semiconductor device and the second device comprises circuitry switchable by the driver circuitry.

9. A module for a lighting system, comprising:
an LED driver device; and
an LED array device arranged on the LED driver device, wherein the LED array device comprises a plurality of conductive studs electrically coupled to a plurality of conductive contact pads on the LED driver device by a plurality of connection structures,
wherein each of the connection structures comprises an adhesive comprising an organic component arranged between a distal end of one of the conductive studs and one of the contact pads and a conductive layer,
wherein the conductive layer extends on side faces of the conductive stud, side faces of the adhesive and on the contact pad,
wherein the conductive layer has a melting point of at least 600° C.

10. The module of claim 9, wherein the LED driver device comprises a plurality of current sources and the LED array device comprises a plurality of LED pixels, each current source driving a LED pixel individually.

11. The interconnected structure of claim 1, wherein the interconnection structure is soft solder-free and diffusion solder-free.

12. The interconnected structure of claim 1, wherein the adhesive layer is enclosed on a top face by the conductive stud, on side faces by the conductive layer, and on a bottom face by the contact pad.

13. The interconnected structure of claim 1, wherein the conductive layer covers side faces of the contact pad and side faces of the adhesive layer.

14. The interconnected structure of claim 13, wherein the conductive layer entirely covers side faces of the conductive stud.

15. The interconnected structure of claim 1, wherein a lateral extent of the adhesive layer is less than or substantially same as a lateral extent of the conductive stud.

16. The interconnected structure of claim 1, further comprising an adhesion promotion layer or a diffusion barrier layer applied to the conductive stud and the contact pad, wherein the adhesion promotion layer or the diffusion barrier layer separates the conductive stud and the contact pad from the conductive layer.

17. The interconnected structure of claim 1, further comprising a corrosion resistance layer deposited on the conductive layer.

18. The interconnected structure of claim 1, wherein the first and second semiconductor devices each comprise planar first major surfaces, wherein the first major surface of the first semiconductor device faces the first major surface of the second semiconductor device, wherein the conductive stud extends away from the first major surface of the first semiconductor device so that the distal end is arranged opposite the first major surface of the first semiconductor device.

19. The interconnected structure of claim 18, wherein the adhesive layer and the contact pad are each disposed completely inside of a region between the first major surfaces of the first and second semiconductor devices.

* * * * *

UNITED STATES PATENT AND TRADEMARK OFFICE
CERTIFICATE OF CORRECTION

| | | |
|---|---|---|
| PATENT NO. | : 10,361,178 B2 | Page 1 of 1 |
| APPLICATION NO. | : 14/868488 | |
| DATED | : July 23, 2019 | |
| INVENTOR(S) | : M. Standing | |

It is certified that error appears in the above-identified patent and that said Letters Patent is hereby corrected as shown below:

In the Claims

Column 10, Lines 36, 37 (Claim 15, Lines 2, 3) please change "substantially same" to -- substantially the same --

Signed and Sealed this
Third Day of September, 2019

Andrei Iancu
*Director of the United States Patent and Trademark Office*